United States Patent
Choi

(10) Patent No.: US 8,390,194 B2
(45) Date of Patent: Mar. 5, 2013

(54) FLAT PANEL DISPLAY DEVICE AND METHOD OF MANUFACTURING THE SAME

(75) Inventor: Jung-Mi Choi, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 158 days.

(21) Appl. No.: 12/956,043

(22) Filed: Nov. 30, 2010

(65) Prior Publication Data
US 2011/0242792 A1 Oct. 6, 2011

(30) Foreign Application Priority Data
Apr. 1, 2010 (KR) ........................ 10-2010-0029999

(51) Int. Cl.
H01L 51/50 (2006.01)
H01L 51/56 (2006.01)
H01L 51/52 (2006.01)

(52) U.S. Cl. .......................... 313/512; 445/25

(58) Field of Classification Search .................. 313/512; 445/25; 438/127; 257/100, E21.502
See application file for complete search history.

(56) References Cited

U.S. PATENT DOCUMENTS

| | | | |
|---|---|---|---|
| 6,226,890 B1 * | 5/2001 | Boroson et al. ................... | 34/472 |
| 6,717,052 B2 | 4/2004 | Wang et al. | |
| 7,193,366 B2 * | 3/2007 | Tomimatsu et al. .......... | 313/512 |
| 2007/0172971 A1 * | 7/2007 | Boroson ........................ | 438/26 |
| 2009/0236981 A1 | 9/2009 | Chang et al. | |
| 2010/0075563 A1 * | 3/2010 | Matsui et al. ................... | 445/25 |
| 2010/0258346 A1 * | 10/2010 | Chen et al. ..................... | 174/521 |
| 2011/0183575 A1 * | 7/2011 | Ryu et al. ........................ | 445/25 |

FOREIGN PATENT DOCUMENTS

| | | |
|---|---|---|
| JP | 2003-203763 A | 7/2003 |
| JP | 2005-19300 | 1/2005 |
| JP | 2005-285573 | 10/2005 |
| KR | 10-0500607 | 7/2005 |
| KR | 1020060023271 | 3/2006 |
| KR | 10-0637172 | 10/2006 |
| KR | 1020090099744 | 9/2009 |

OTHER PUBLICATIONS

Korean Office action issued by Korean Industrial Property Office on Jul. 27, 2011, corresponding to KR 10-2010-0029999 and Request for Entry attached herewith.
Korean Notice of Allowance issued on Feb. 16, 2012 in connection with Korean Patent Application Serial No. 10-2010-0029999 and Request for Entry of the Accompanying Office Action attached herewith.
English-language abstract of Korean Patent Publication No. 10-2003-0042169, May 28, 2003.
English-language abstract of Korean Patent Publication No. 10-2006-0025762, Mar. 22, 2006.

* cited by examiner

*Primary Examiner* — Mariceli Santiago
*Assistant Examiner* — Glenn Zimmerman
(74) *Attorney, Agent, or Firm* — Robert E. Bushnell, Esq.

(57) ABSTRACT

A flat panel display device and a method of manufacturing the same, the flat panel display device including: a glass substrate; a metal encapsulation substrate facing the glass substrate; a light-emitting unit interposed between the glass substrate and the metal encapsulation substrate; a first sealing unit interposed between the glass substrate and the metal encapsulation substrate, arranged around the light-emitting unit, and comprising a first sealant and a second sealant. The first sealant is disposed around the light-emitting unit and may include a UV-curable material. The second sealant is coated on the first sealant and may include a thermally-curable material.

20 Claims, 3 Drawing Sheets

FLAT PANEL DISPLAY DEVICE AND METHOD OF MANUFACTURING THE SAME

CROSS-REFERENCE TO RELATED APPLICATION

This application claims the benefit of Korean Patent Application No. 10-2010-0029999, filed on Apr. 1, 2010, in the Korean Intellectual Property Office, the disclosure of which is incorporated herein, by reference.

BACKGROUND

1. Field

One or more embodiments of the present invention relate to a flat panel display device and a method of manufacturing the flat panel display device 2. Description of the Related Art Recently, flat panel display devices have increased in popularity. Among flat panel display devices, electroluminescent display devices, which are self-emitting display devices, have attracted attention as the next generation of display devices, because of their wide viewing angle, excellent contrast ratio, and short response time. Organic light-emitting display devices include a light-emitting layer formed of an organic material, and form brighter images, have a lower driving voltage, and a shorter response time, as compared to inorganic light-emitting display devices.

However, a light-emitting unit of the organic light-emitting display device may deteriorate, due to the penetration of moisture. Thus, in order to prevent the penetration of external moisture, an organic light-emitting display device should include an encapsulation structure, so as to seal and protect the light-emitting unit.

According to the related art, an encapsulation structure includes a glass encapsulation substrate formed over a light-emitting unit disposed on a glass substrate. A sealant is used to seal a gap between the glass substrate and the encapsulation substrate. The sealant, may comprise an ultraviolet (UV)-curable material. The sealant is coated around the light-emitting unit, on the glass substrate, to attach the encapsulation substrate to the glass substrate. Then UV rays are radiated to cure the sealant, so that the glass substrate and the encapsulation substrate are tightly adhered to each other.

However, this encapsulation structure uses an expensive glass material as the encapsulation substrate. In order to solve this problem, a solution has been proposed where the encapsulation substrate is formed of a metal, such as stainless steel or aluminum. However, such a metal encapsulation substrate reflects UV rays, making it difficult to use a UV-curable material sealant. In addition, even if a different type of sealant is used, sealants capable of adhering different materials often suffer from degradation over time and/or weak bonding strength.

Thus, there is a demand for a sealing unit that insures a strong adhesion between a low cost metal encapsulation substrate and a glass substrate.

SUMMARY

One or more embodiments of the present invention include a flat panel displace device having a strong adhesion between a metal encapsulation substrate and a glass substrate, and a method of manufacturing the flat panel displace device.

According to one or more embodiments of the present invention, a flat panel display device includes a glass substrate; a metal encapsulation substrate facing the glass substrate; a light-emitting unit interposed between the glass substrate and the metal encapsulation substrate; and a sealing unit disposed around the light-emitting unit, comprising a first sealant disposed around the light-emitting unit, and a second sealant coated on the first sealant.

According to various embodiments, the first sealant may be coated so as form a structure that projects from the surface of the metal encapsulation substrate, toward the glass substrate.

According to various embodiments, the first sealant may include a UV-curable material coated on a desiccant.

According to various embodiments, the second sealant may include an epoxy-based adhesive, a silicon adhesive, or an acryl adhesive.

According to various embodiments, the viscosity of the second sealant may be less than the viscosity of the first sealant, during the coating of the second sealant.

According to various embodiments, a desiccant may be filled in an internal space between the glass substrate and the metal encapsulation substrate. The desiccant may include calcium oxide (CaO), barium oxide (BaO), Zeolite, an Aluminum (Al)-based organic metal complex, or a polyacrylic acid.

According to one or more embodiments of the present invention, a method of manufacturing a flat panel display device includes: forming a light-emitting unit on a glass substrate; coating a first sealant on a surface of a metal encapsulation substrate; partially curing the first sealant; coating a second sealant on the first sealant; adhering the metal encapsulation substrate and the glass substrate; and curing the second sealant and the first sealant.

According to various embodiments, the first sealant may be coated so as to form a structure that projects away from the surface of the metal encapsulation substrate, toward the glass substrate.

According to various embodiments, the first sealant may include a UV-curable material coated on a desiccant.

According to various embodiments, the second sealant may include an epoxy-based adhesive, a silicon adhesive, or an acryl adhesive.

According to various embodiments, the viscosity of the second sealant may be less than the viscosity of the first sealant, during the coating of the second sealant.

According to various embodiments, the method may further include disposed a desiccant in an internal space formed between the glass substrate and the metal encapsulation substrate. The desiccant may include calcium oxide (CaO), barium oxide (BaO), Zeolite, an Aluminum (Al)-based organic metal complex, or a polyacrylic acid.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which.

DETAILED DESCRIPTION

Figure 1:
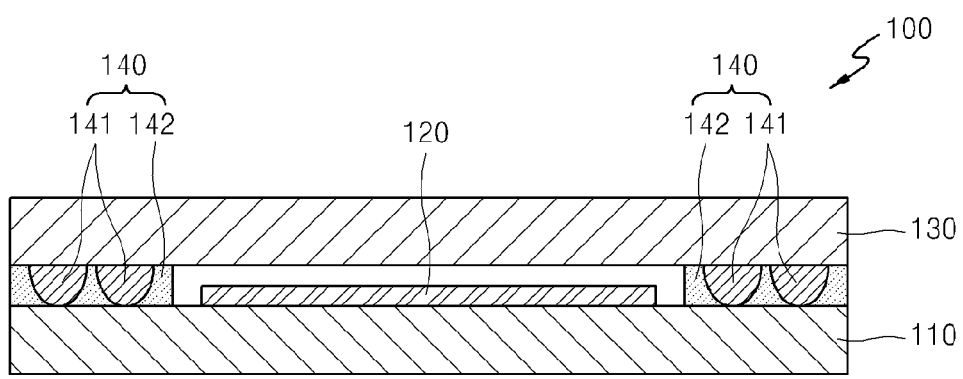
FIG. 1 is a diagram of a flat panel display device, according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

FIG. 1 is a diagram of a flat panel display device 100, according to an exemplary embodiment of the present invention. As illustrated in FIG. 1, the flat panel display device 100 includes a glass substrate 110, a light-emitting unit 120 formed on the glass substrate 110, and a metal encapsulation substrate 130 covering the light-emitting unit 120.

The light-emitting unit 120 may be an organic light-emitting unit, in which an organic layer is formed between a pair of opposing electrodes. Although not illustrated in FIG. 1, a passivation layer may be formed on the light-emitting unit 120 to protect the same.

The metal encapsulation substrate 130 prevents the penetration of external moisture into the light-emitting unit, by covering the light-emitting unit 120. The metal encapsulation substrate 130 may be formed of, for example, stainless steel or aluminum. The metal encapsulation substrate 130 material is substituted for an expensive glass encapsulation substrate used in the related art and thus, reduces costs. A sealing unit 140 is provided between the encapsulation substrate 130 and the substrate 110. That is, the metal encapsulation substrate 130 and the glass substrate 110 are adhered to each other using the sealing unit 140, so as to seal an internal space in which the light-emitting unit 120 is arranged.

The sealing unit 140 includes a first sealant 141 and a second sealant 142. The first sealant 141 includes a UV-curable material. The second sealant 142 includes a thermally-curable material. The second sealant 142 is coated on the first sealant 141, such that the first sealant 141 is disposed within the second sealant 142. The second sealant 142 operates to adhere and seal the glass substrate 110 and the metal encapsulation substrate 130. The first sealant 141 enlarges the surface area of the sealing unit 140, thereby increasing the adhesiveness thereof.

The first sealant 141 is applied to the metal encapsulation substrate 130, so as to have an embossment shape. In other words, the first sealant 141 is coated so as to form a structure that projects away from the encapsulation substrate 130. More specifically, the first sealant 141 may be coated so as to contact a greater surface area of the encapsulation substrate 130 than the glass substrate 100, when the same are attached.

The second sealant 142 is coated on the first sealant 141. A contact area of the glass substrate 110 and the sealing unit 140 is thereby increased, so that the adhesion of the sealing unit 140 is also increased. In particular, the second sealant 142 may be coated so as to contact a larger surface area of the glass substrate 110 than the first sealant 141, and may contact a smaller surface area of the encapsulation substrate 130 than the first sealant 141. Also, since the second sealant 142 is heat cured, performs the adhering and sealing operations, it is possible to prevent a problem in which ultraviolet rays are reflected on the metal encapsulation substrate 130, such that a curing operation is not appropriately performed, as when only a UV-curable material is used.

Figure 2:
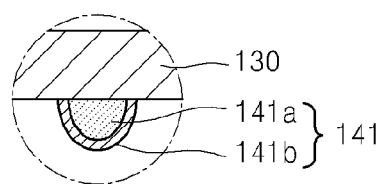
FIG. 2 is a magnified partial view of a portion of the flat panel display device of FIG. 1.
Figure 3A:
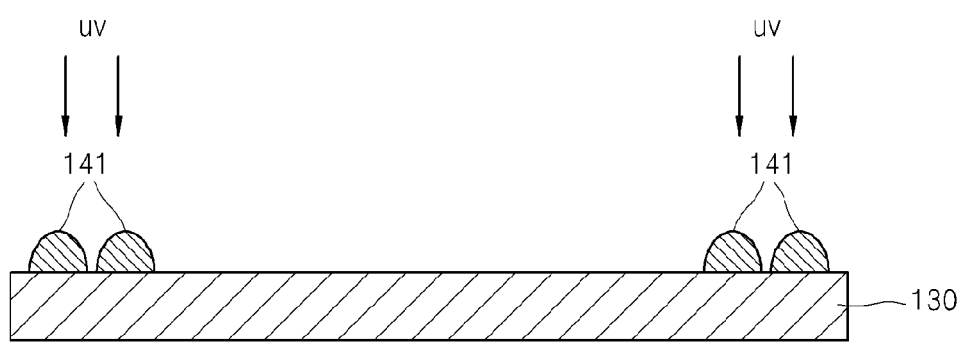
FIGS. 3A through 3C are cross-sectional views describing a method of manufacturing the flat panel display device of FIG. 1.
Figure 3B:
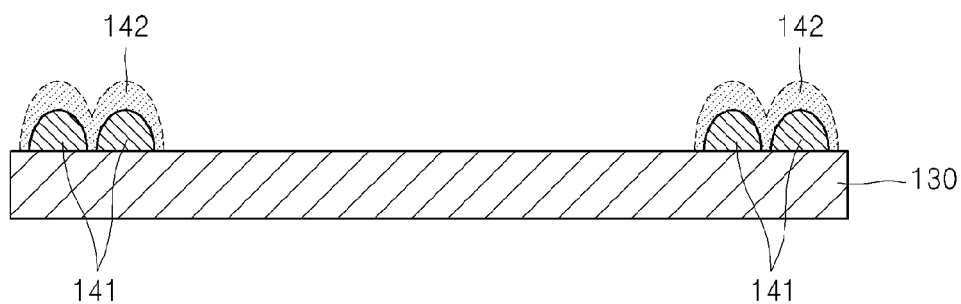
Figure 3C:
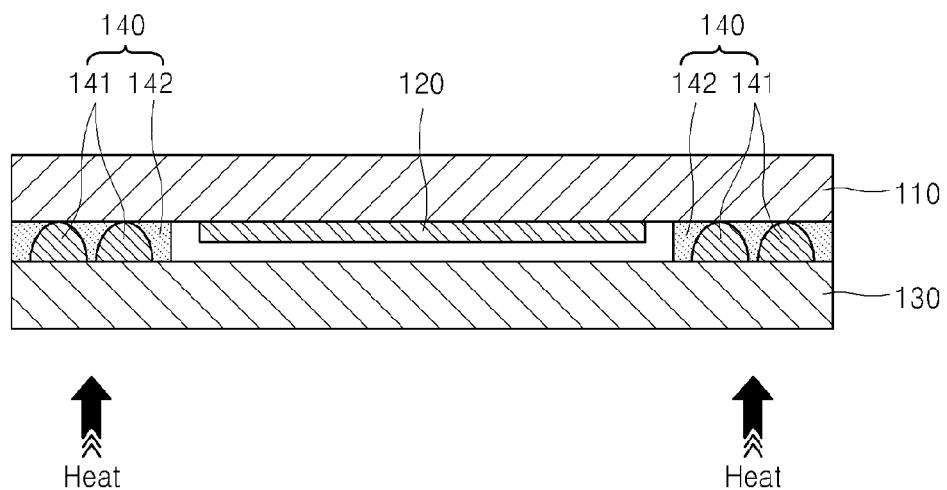

The flat panel display device 100 may be manufactured via processes shown in FIGS. 3A through 3C. As illustrated in FIG. 3A, the first sealant 141 is coated on edge portions of the metal encapsulation substrate 130, so as to form a raised structure on the substrate 130. The first sealant 141 may include only the UV-curable material, or as illustrated in FIG. 2, the first sealant 141 may include a desiccant 141a that is coated with a UV-curable material 141b. The desiccant 141a may operate as a barrier to the penetration of external moisture. After applying the first sealant 141, ultraviolet rays are radiated to cure the first sealant 141.

However, the first sealant 141 is generally not completely cured. Instead, the first sealant 141 is approximately 70-80% cured. The second sealant 142 is heated, during the subsequent thermal curing of the second sealant 142, such that the remaining 20-30% of the curing process of the first sealant 141 occurs. The first sealant 141 is partially cured to the extent that the shape of the first sealant 141 may be maintained. If the first sealant 141 is completely cured by the UV light, when the metal encapsulation substrate 130 and the glass substrate 110 are adhered, the adhesion between the first sealant 141 the glass substrate 110 may be reduced.

After the first sealant 141 is coated and partially cured, as illustrated in FIG. 3B, the second sealant 142 coated on the first sealant 141. The second sealant comprises a thermally-curable material, such as an epoxy-based adhesive, a silicon adhesive, an acryl adhesive, or the like, or a combination thereof. The second sealant 142 is coated around and between the shaped first sealant 142. The second sealant 142 may have a viscosity that is less than that of the first sealant 141, during the coating, so as to facilitate the coating.

Afterward, as illustrated in FIG. 3C, the metal encapsulation substrate 130 is adhered to the glass substrate 110, such that the light-emitting unit 120 is sealed in a space formed between the substrate 110, the encapsulation substrate 130, and the sealing unit 140. Heat is then applied to the sealing unit 140 to cure the first sealant 141 and the second sealant 142, so that a firmly adhered and sealed state is achieved. Since the second sealant 142 directly contacts the glass substrate 110 and is coated on the first sealant 141, the adhesive surface area of the second sealant 142 is increased, as compared to a case in which the second sealant 142 is directly coated on the flat surface of the metal encapsulation substrate 130. Accordingly, the overall adhesion of the sealing unit 140 may be increased accordingly.

Therefore, the flat panel display device 100 has a sealing structure, in which the deterioration of adhesion may be prevented. In other words, excellent adhesion can be obtained, even though the low-priced metal encapsulation substrate 130 is used.

Figure 4:
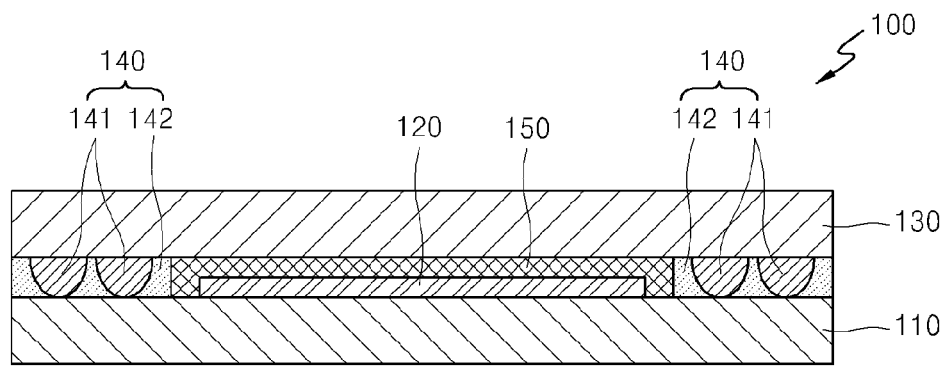
FIG. 4 is a diagram of a flat panel display device, according to another exemplary embodiment of the present invention.

As illustrated in FIG. 4, a desiccant 150 may be formed on the light-emitting unit, so as to fill an internal space formed between the glass substrate 110, the metal encapsulation substrate 130, and the sealing unit 140. The desiccant 150 may include calcium oxide (CaO), barium oxide (BaO), Zeolite, an Aluminum (Al)-based organic metal complex, a polyacrylic acid, or the like, or a combination thereof. By filling the internal space with the desiccant 150, it is possible to prevent moisture that penetrates the device 100 from degrading the light-emitting unit 120.

According to various embodiments of the present invention, provided is a flat panel display device having excellent adhesion between a glass substrate and a metal encapsulation substrate, due to having a multi-sealant structure. Accordingly, a low-priced metal encapsulation substrate may be utilized in place of an expensive glass encapsulation substrate. The improved adhesion also increases the reliability of the display device.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. A flat panel display device comprising: a glass substrate; a metal encapsulation substrate disposed facing the glass substrate; a light-emitting unit disposed between the glass substrate and the metal encapsulation substrate; and a sealing unit disposed around the light emitting unit to adhere the glass substrate to the metal encapsulation substrate, the sealing unit comprising: a first sealant disposed around the light-emitting unit disposed on the metal encapsulation substrate; and a second sealant coated on the first sealant, wherein the first sealant and the second sealant both directly contacting the glass substrate and the metal encapsulation substrate, the second sealant directly contacting substantially an entirety of the first sealant surface that is not directly contacting the metal encapsulation substrate and the glass substrate, the first sealant coming into direct contact with a larger surface area of the metal encapsulation substrate than with the glass substrate, and the second sealant coming into direct contact with a larger surface area of the glass substrate than with the metal encapsulation substrate.

2. The flat panel display device of claim 1, wherein the first sealant forms a projection that extends away from the metal encapsulation substrate, toward the glass substrate.

3. The flat panel display device of claim 1, wherein the first sealant comprises a UV-curable material.

4. The flat panel display device of claim 1, wherein the first sealant comprises a desiccant and a UV-curable material coated on the desiccant.

5. The flat panel display device of claim 1, wherein the second sealant comprises a thermally-curable material.

6. The flat panel display device of claim 1, wherein the second sealant comprises an epoxy-based adhesive, a silicon adhesive, or an acryl adhesive.

7. The flat panel display device of claim 1, wherein the viscosity of the second sealant is less than the viscosity of the first sealant, when the second sealant is coated on the first sealant.

8. The flat panel display device of claim 1, further comprising a desiccant coated on the light-emitting unit and disposed between the glass substrate, the metal encapsulation substrate.

9. The flat panel display device of claim 8, wherein the desiccant comprises calcium oxide (CaO), barium oxide (BaO), Zeolite, an Aluminum (Al)-based organic metal complex, a polyacrylic acid, or a combination thereof.

10. A method of manufacturing a flat panel display device, the method comprising:
    forming a light-emitting unit on a glass substrate;
    coating a first sealant on a surface of a metal encapsulation substrate;
    partially curing the first sealant;
    coating second sealant on the first sealant to completely encompass and surround the first sealant except where the first sealant directly contacts the metal encapsulation substrate;
    adhering the metal encapsulation substrate to the glass substrate using the first and second sealants, such that the first and second sealants both directly contact the metal encapsulation substrate and the glass substrate, and surround the light-emitting unit; and
    curing the second sealant and the first sealant.

11. The method of claim 10, wherein the first sealant is coated so as to form a projection that extends from the metal encapsulation substrate, toward the glass substrate.

12. The method of claim 10, wherein the first sealant comprises a UV-curable material.

13. The method of claim 10, wherein the first sealant comprises a desiccant and a UV-curable material coated on the desiccant.

14. The method of claim 10, wherein the second sealant comprises a thermally-curable material.

15. The method of claim 10, wherein the second sealant comprises an epoxy-based adhesive, a silicon adhesive, or an acryl adhesive.

16. The method of claim 10, wherein the viscosity of the second sealant is less than the viscosity of the first sealant, during the coating of the second sealant.

17. The method of claim 10, further comprising coating the light emitting unit with a desiccant, so as to fill an internal space between the glass substrate and the metal encapsulation substrate.

18. The method of claim 17, wherein the desiccant comprises calcium oxide (CaO), barium oxide (BaO), Zeolite, an Aluminum (Al)-based organic metal complex, a polyacrylic acid, or a combination thereof.

19. The flat panel display device of claim 1, wherein the first sealant directly contacts a larger surface area of the metal encapsulation substrate than the second sealant.

20. The flat panel display device of claim 19, wherein the second sealant directly contacts a larger surface area of the glass substrate than the first sealant.

* * * * *